United States Patent
Yabe

(10) Patent No.: US 7,507,035 B2
(45) Date of Patent: Mar. 24, 2009

(54) OPTICAL MODULE WITH METAL STEM AND METAL CAP RESISTANCE-WELDED TO STEM

(75) Inventor: Hiroyuki Yabe, Kanagawa (JP)

(73) Assignee: Sumitomo Electric Industries, Ltd., Osak-shi (JP)

( * ) Notice: Subject to any disclaimer, the term of this patent is extended or adjusted under 35 U.S.C. 154(b) by 0 days.

(21) Appl. No.: 11/878,168

(22) Filed: Jul. 20, 2007

(65) Prior Publication Data

US 2008/0025678 A1    Jan. 31, 2008

(30) Foreign Application Priority Data

Jul. 21, 2006    (JP)    ............... 2006-198899

(51) Int. Cl.
*G02B 6/36* (2006.01)
(52) U.S. Cl. .............. 385/91; 385/92; 385/93; 385/94; 385/88; 385/77
(58) Field of Classification Search ............ 385/92, 385/94, 91, 88, 77, 75
See application file for complete search history.

(56) References Cited

U.S. PATENT DOCUMENTS

| | | | | |
|---|---|---|---|---|
| 6,005,276 A | * | 12/1999 | Forrest et al. | 257/432 |
| 6,061,493 A | * | 5/2000 | Gilliland et al. | 385/140 |
| 6,999,644 B1 | * | 2/2006 | Lebby et al. | 385/14 |
| 7,329,056 B2 | * | 2/2008 | Sherrer et al. | 385/93 |
| 2003/0223709 A1 | * | 12/2003 | Lake et al. | 385/94 |
| 2005/0111797 A1 | * | 5/2005 | Sherrer et al. | 385/93 |
| 2008/0075409 A1 | * | 3/2008 | Liu | 385/93 |

FOREIGN PATENT DOCUMENTS

| JP | 06-140644 A | 5/1994 |
|---|---|---|
| JP | 09-258070 A | 10/1997 |
| JP | 2003-320462 A | 11/2003 |

* cited by examiner

*Primary Examiner*—James P Hughes
(74) *Attorney, Agent, or Firm*—Venable LLP; Michael A. Sartori; Steven J. Schwarz

(57) ABSTRACT

The present invention provides a new arrangement of the stem and the cap resistance-welded to the stem, in which the deformation induced by the welding in a portion adjacent to the projection does not cause the failure for the assembly of the module. The cap and the stem of the present module provided first and second portions. The diameter of the second portion is greater than that of the first portion such that, even the welding deforms the first portions of the cap and the stem; the deformed portion is inside of respective second portions.

10 Claims, 7 Drawing Sheets

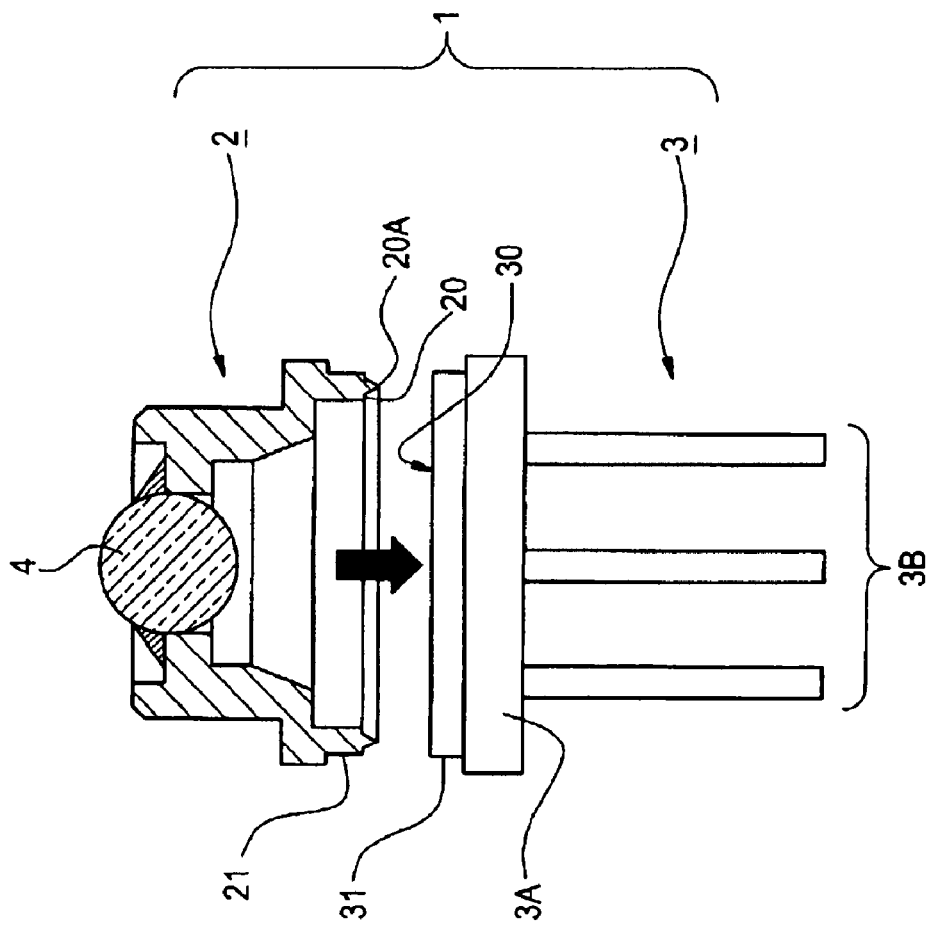
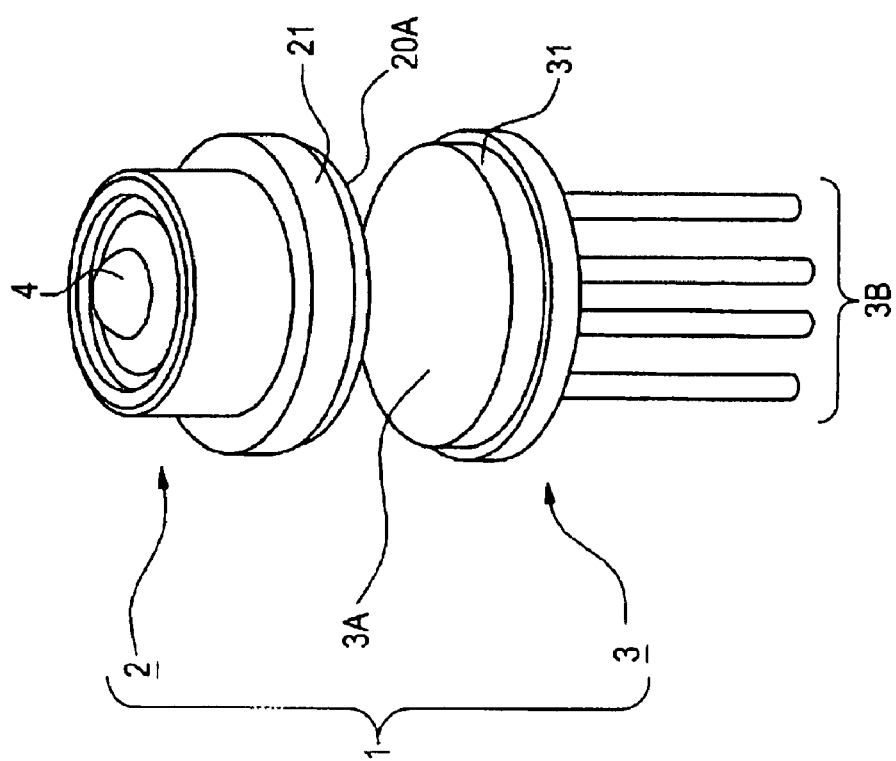

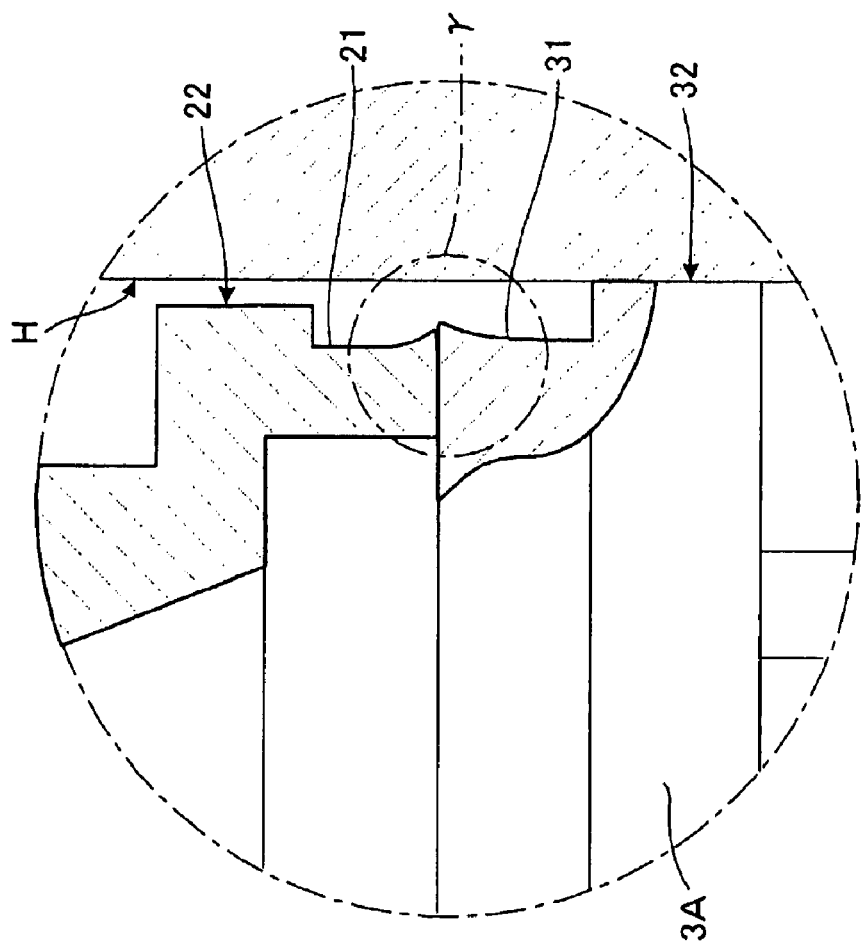
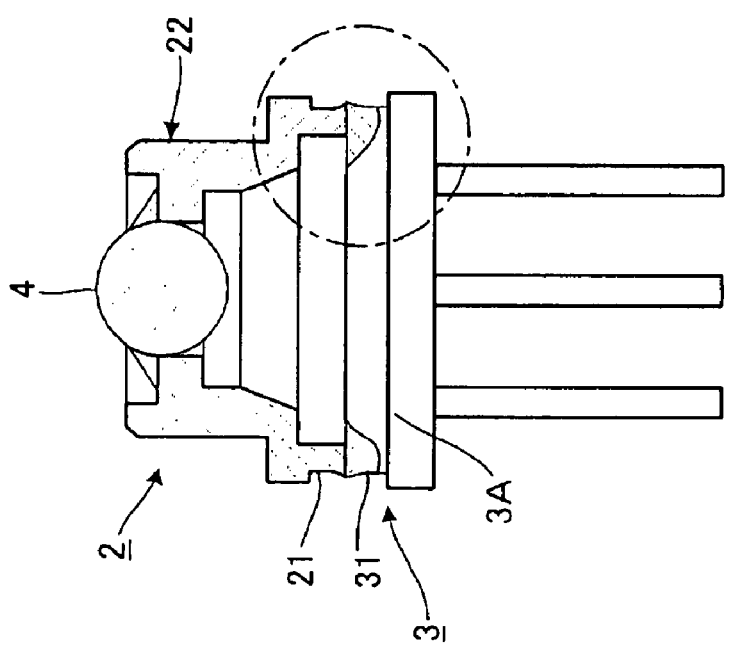
FIG. 3B
FIG. 3A

OPTICAL MODULE WITH METAL STEM AND METAL CAP RESISTANCE-WELDED TO STEM

BACKGROUND OF THE INVENTION

1. Field of the Invention

The present invention relates to an optical module that provides a body with a stem where a semiconductor optical device is mounted thereon and extends a plurality of lead pins therefrom, and a cap resistance-welded to the stem to form a cavity where the semiconductor optical device is air-tightly sealed.

2. Related Prior Art

An optical module generally provides the body, which includes the stem that is made of metal, mounts the semiconductor optical device and holds the lead pins air-tightly sealed by the seal glass, and the metal cap with a glass plate or a lens in a top thereof to pass the optical signal therethrough. The cap is typically resistance-welded to the metal stem.

In the resistance-welding, at least one of the cap and the stem forms a rib or interposes a member with a projection between the cap and the stem, and a quite large current is supplied and concentrated on the tip portion of the projection to melt the projection as pressing the cap and the stem to each other to fix both members.

A Japanese Patent Application published as JP-H06-140644A has disclosed an optical module that provides a lens holder covering the cap and providing a V-groove into which members for the resistance-welding are set. This arrangement can narrower the are coming in contact at the welding, which enables to increase the current density for the welding, that is, the total current may be reduced and the excess heating of the devices installed in the optical module may be escaped. However, the arrangement of the lens holder mentioned above covers the side of the stem where the projection is also provided. Although it reliably secures the air-tightness, the arrangement inevitably widens the module.

The resistance-welding is necessary to press the members to be welded to each other, which causes the deformation of the welded portions because the mechanical stress is applied to a portion where the Joule heat is generated at the welding. For the optical module, as shown in the prior document mentioned above, the cap is resistance-welded to the stem. The portion adjacent and periphery to the projection of the cap or the stem may be stuck out compared to those before the welding.

Another Japanese Patent Application published as JP-2003-320462A has suggested an arrangement that enables to escape the module from the above subject, in which the projection accompanies with hollows in both sides of the projection. The melted and deformed portion of the projection may be set within the hollows. However, this arrangement of the projection may be unfavorable from the viewpoint of the airtightness after the resistance-welding.

The present invention is to provide an arrangement for the resistance-welding that enables, even when the welding accompanies the mechanical deformation and the large Joule heat, to absorb the deformation and to escape the device in the module from the heating.

SUMMARY OF THE INVENTION

An optical module according to the present invention has a metal cap and a metal stem that constitute, what is called, a co-axial package, where the metal cap is fixed to the stem by the resistance-welding. The cap of the invention provides first and second portions with first and second diameters, respectively. The second diameter is greater than the first diameter by an amount such that an end portion of the cap deformed by the resistance welding is within the outer most surface of the second portion. Similarly, the stem provides first and second portions with third and fourth diameters, respectively. The fourth diameter is greater than the third diameter by an amount such that an end of the second portion of the stem deformed by the resistance-welding is within the outermost surface of the second portion of the stem.

In another embodiment of the present invention, an optical module with the co-axial package comprises a metal stem and a metal cap fixed to the stem by the resistance-welding. The stem provides a groove in a primary surface thereof to which the metal cap is to be resistance-welded. The groove is formed along an inner edge of a ring rib formed in an end of the cap such that the groove may separates the ring rib from the lead pin extending from the stem. The groove may have a rectangular cross section or a triangular cross section, and may be divided in a plurality of arched portion such that each portion has a same radius to each other and separates the corresponding lead pin from the ring rib of the metal cap.

BRIEF DESCRIPTION OF DRAWINGS

FIG. 1A is a perspective view showing an optical module according to the first embodiment of the present invention, and FIG. 1B is a cross section of the module;

FIG. 3A is a cross section of the module whose cap is welded to the stem, and FIG. 3B magnifies the welded portion of the cap and the stem;

FIG. 6A illustrates a thermal distribution at the welding for the arrangement of the second embodiment shown in FIGS. 4A and 4B, while.

DESCRIPTION OF PREFERRED EMBODIMENTS

Next, preferred embodiments of the present invention will be described as referring to accompanying drawings. In the description, the same numerals or the same symbols will refer to the same elements without overlapping explanations.

First Embodiment

Figure 2:
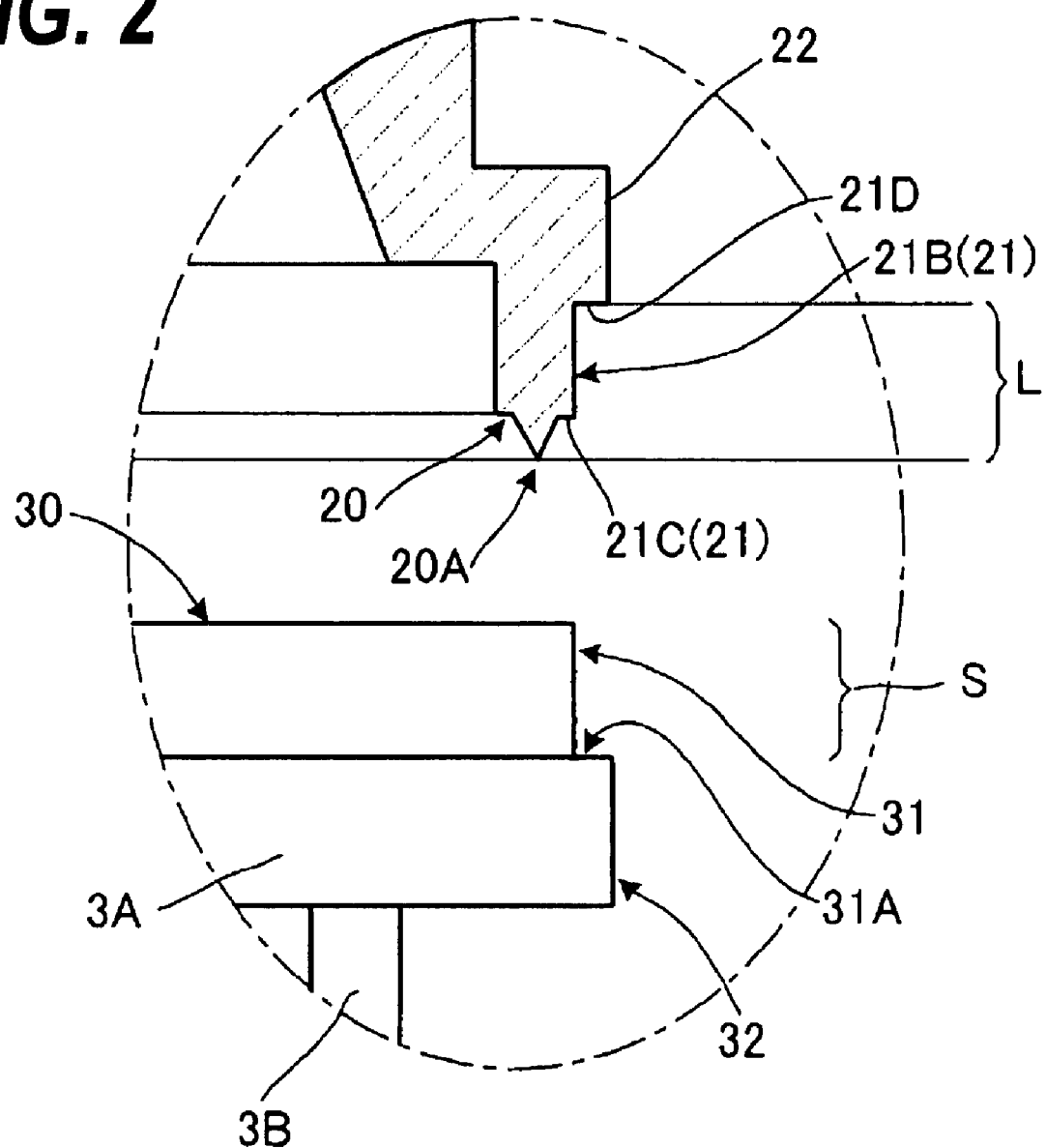
FIG. 2 magnifies a portion to be resistance-welded of the optical module shown in FIG. 1.

FIGS. 1A and 1B show an optical module according to an embodiment of the present invention. The optical module shown in FIGS. 1 and 2 provides the cap 2 and the body 3 constituting a co-axial package, where the cap 2 is fixed to the body 3 by the resistance-welding. The cap 2 provides two portions, one of which has relatively larger diameter, while, the other has the smaller diameter. The cap 2 also provides a step between these two portions and a lens. The cap may be made of meal such as stainless steel and fixes a lens 4 on the top thereof.

The body 3 includes a stem 3A with a disk shape and a plurality of lead pins 3B extending from the stem 3A. The stem 3A provides a first portion 31 with relatively smaller diameter and a primary surface 30, where a semiconductor optical device is to be mounted thereon, and a second portion with relatively larger diameter, from which the lead pins 3B extend to a direction opposite to the primary surface 30. These cap 2 and the body, in particular the step 3A, forms a cavity that is air-tightly sealed and encloses the semiconductor optical device therein.

FIG. 2 magnifies a portion where the cap 2 is welded to the stem 3A before the welding. The end of the cap 2 provides, as illustrated in FIG. 2, a first lib 21B with a rectangular cross section, which has a height of L and faces the primary surface 30 of the stem 3A. The first lib 21B is deformed when the cap 2 is fixed to the stem 3A as pressing the cap against the stem 3A. Accordingly, the height L may be determined so as not to project from the outermost surface 22 of the cap 2.

The cap 2 further provides a second rib 20A with a triangular cross section on the top 20 of the first rib 21B. The force applied at the resistance-welding concentrates on the tip of the triangle; accordingly, this tip of the triangle constitutes a melting portion at the welding.

The stem 3A, which has a disk shape and is made of metal such as iron (Fe) or Kovar, includes a first portion with a relatively smaller diameter and a second portion with a relatively larger diameter. The first portion mounts the semiconductor optical device on the primary surface 30 thereof. The first portion 31, similar to the end of the cap 2, has a thickness S and provides a room such that, when the cap 2 is welded to the stem 3A, the deformed portion of the cap 2 and that of the stem 3A do not project from the outermost surface of the stem 3A. The first portion may be lathed by a depth corresponding to the step 31A in FIG. 2 from the second portion with the larger diameter. The step 31A may be smaller than a sum of the step 21D and the step 21C in the rib structure of the cap 2, and may be larger or substantially equal to the step 21D. That is, the outer surface of the first portion 31 of the stem 3A positions inside of the outer surface 21B of first rib 21 in the cap 2, and outside of the outer root of the second rib 20A. The outer diameter of the cap 2 may be slightly larger than or substantially equal to that of the body 3.

In the present invention for the optical module, where the cap is fixed to the body by resistance-welding, each welded surface, 20 or 30, provides the portion, 21 or 31, with relatively smaller diameter. Accordingly, even the deformed portions γ project outward when the cap 2 is welded to the body 3 as pressing against the body 3, such deformed portion γ may be prevented, as shown in FIGS. 3A and 3B, to project from the outermost surface of the cap 2 or the stem 3A.

The present invention does not restrict the shape of the first portion, in which the cap and the stem in the embodiment above mentioned provides two portions with different diameters and the step therebetween, another shape, such as a slope connecting the portion with the largest diameter to the other portion with the smallest diameter, may be applicable.

Second Embodiment

Figure 4A:
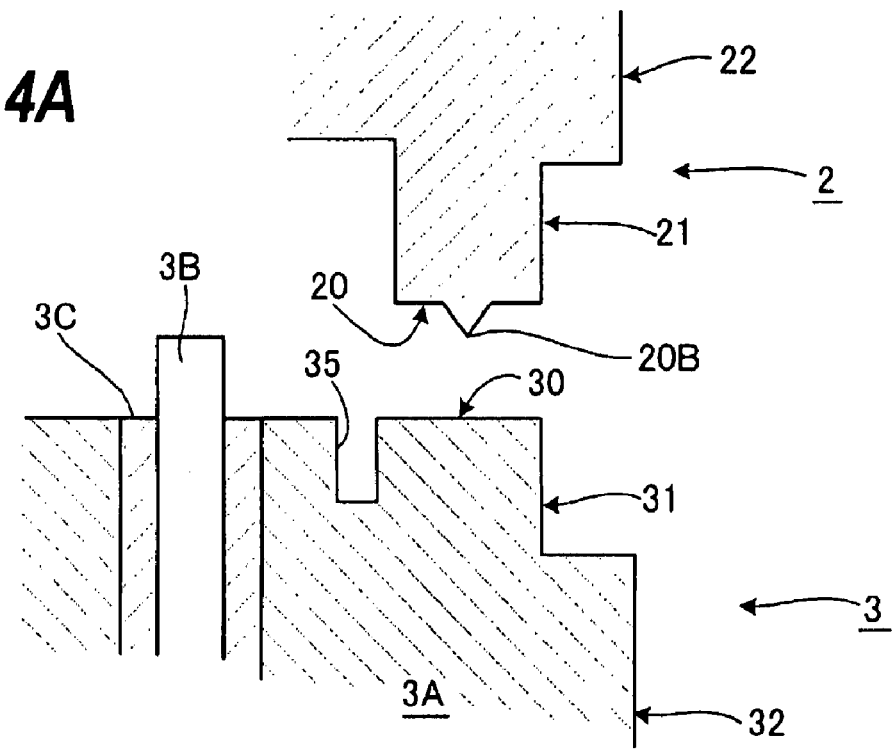
FIG. 4A is a cross section of the cap and the stem to be welded to each other according to the second embodiment of the invention.
Figure 4B:
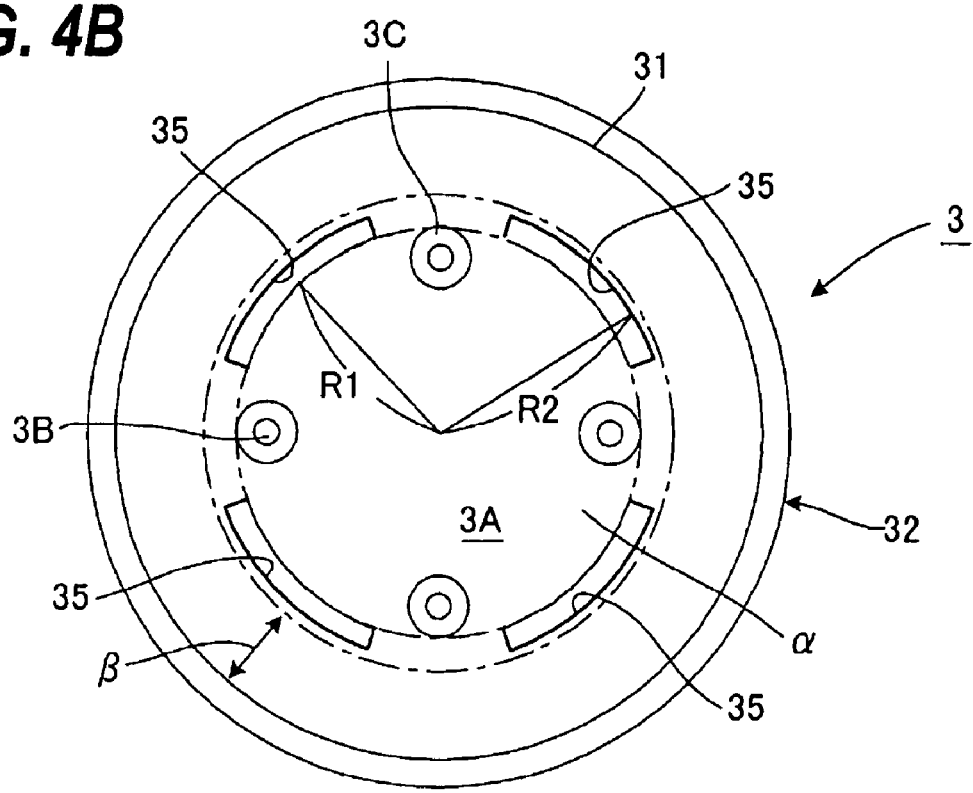
FIG. 4B is a plan view of the stem shown in FIG. 4A.

FIG. 4 illustrates another embodiment of the present invention, where the cap provides a ring shaped rib 20B in the top surface of the first portion 21, while, the primary surface of stem 3A provides a discontinued groove 35 each having an arched shape in positions corresponding to the ring rib 20B. The diameter of the arched groove 35 is slightly smaller than the diameter of the rib 20B, that is, the groove 35 positions inside of the ring rib 20B. Moreover, the lead pin 3B positions between two grooves 35. The lead pins 3B and the seal glass 3C surrounding each lead pin 3B are positioned within the circle α with a radius R1 connecting the center of the stem 3A to the inner surface of the groove 35.

While, the ring rib 20B positions in a doughnut region with the inner radius R2 connecting the center of the stem 3A to the outer surface of the groove 35 and the outer radius substantially identical with the edge of the first portion 31 of the stem 3A.

Figure 5:
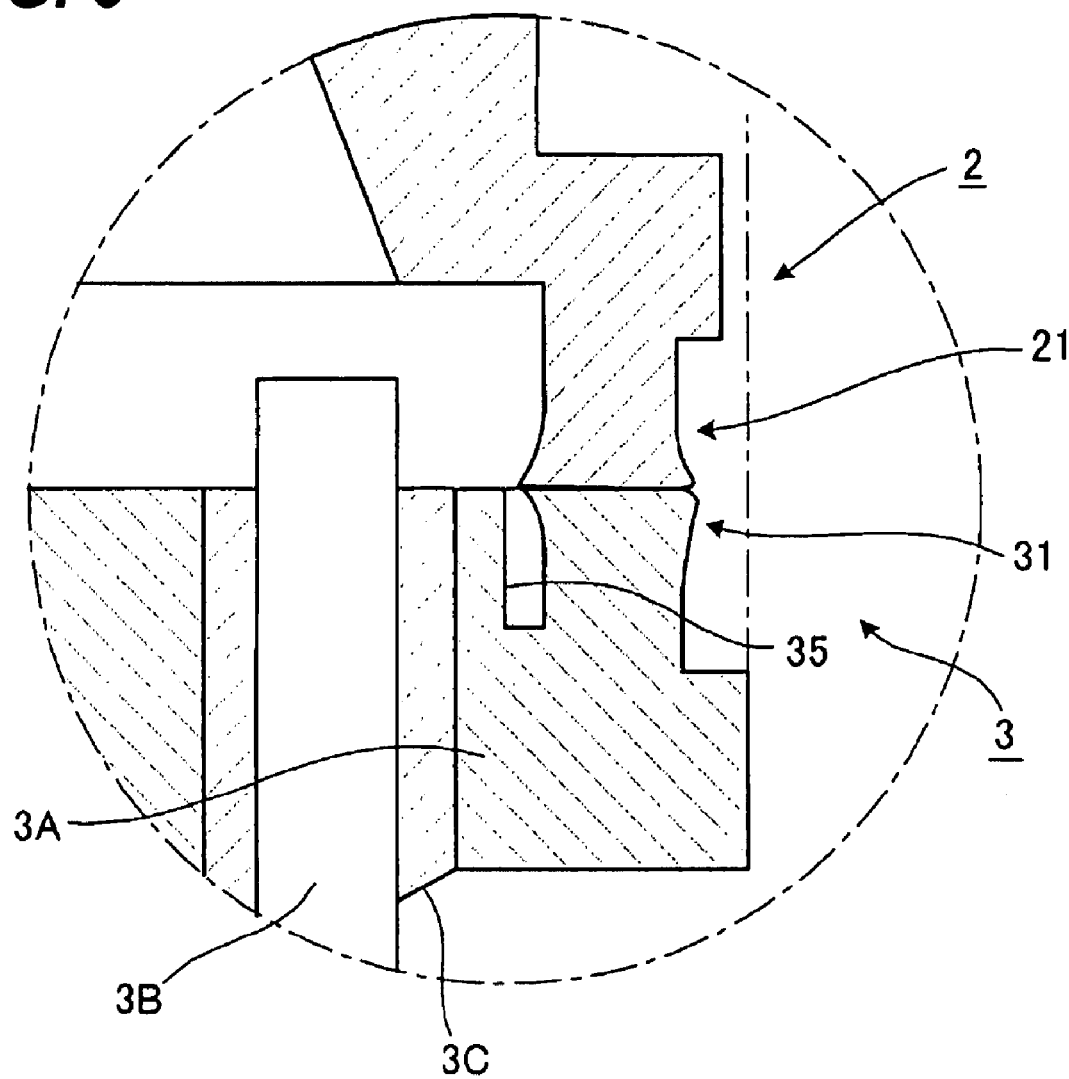
FIG. 5 magnifies the welded portion of the cap and the stem shown in FIGS. 4A and 4B.
Figure 6A:
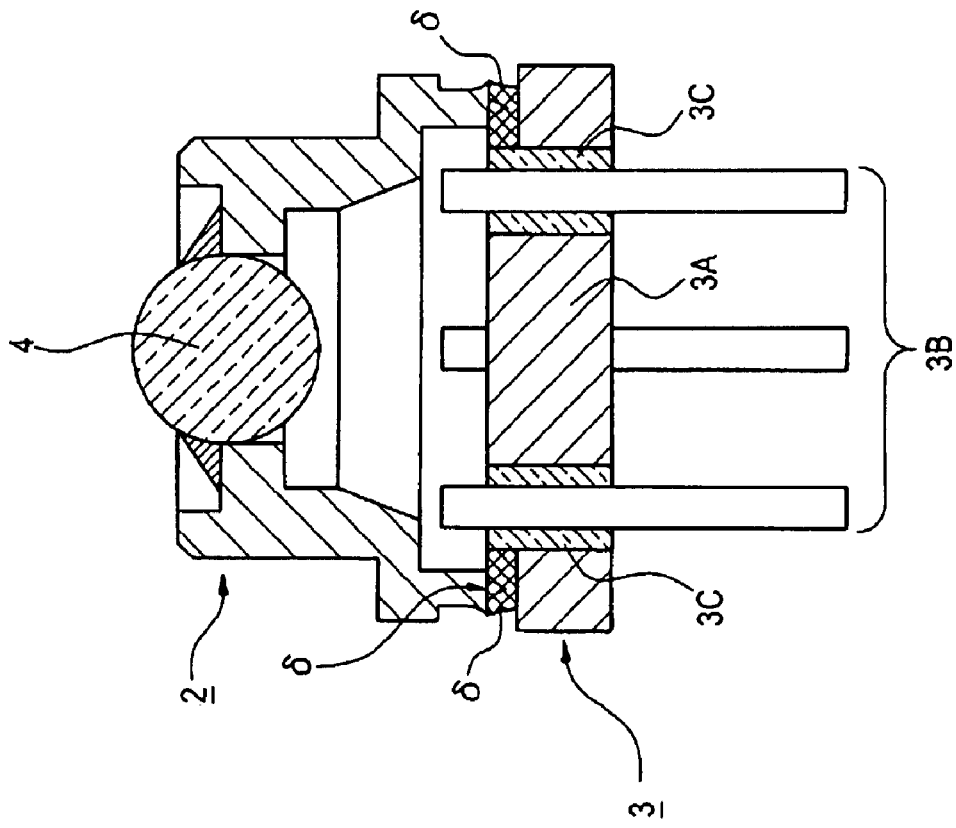

The cap 2 and the stem 3A are thus formed, the obtained module after the resistance-welding of the cap 2 to the stem 3A deforms respective first portions, 21 and 31, and the groove 35 as illustrated in FIG. 5, which prevents the welded portion from projecting outward from the outermost surface of the cap 2 and that of the stem 3A. Moreover, the groove 35 prevents the stem 3A from rushing inward at the resistance-welding. Moreover, the groove 35 may also prevent the heat applied at the welding from conducting inward to the seal glass 3C. The areas δ cross-hatched in FIGS. 6A and 6B denote the region where the heat at the welding conducts. Accordingly, the semiconductor device mounted on the center portion of the stem 3A may be escaped from the heat at the welding.

Figure 6B:
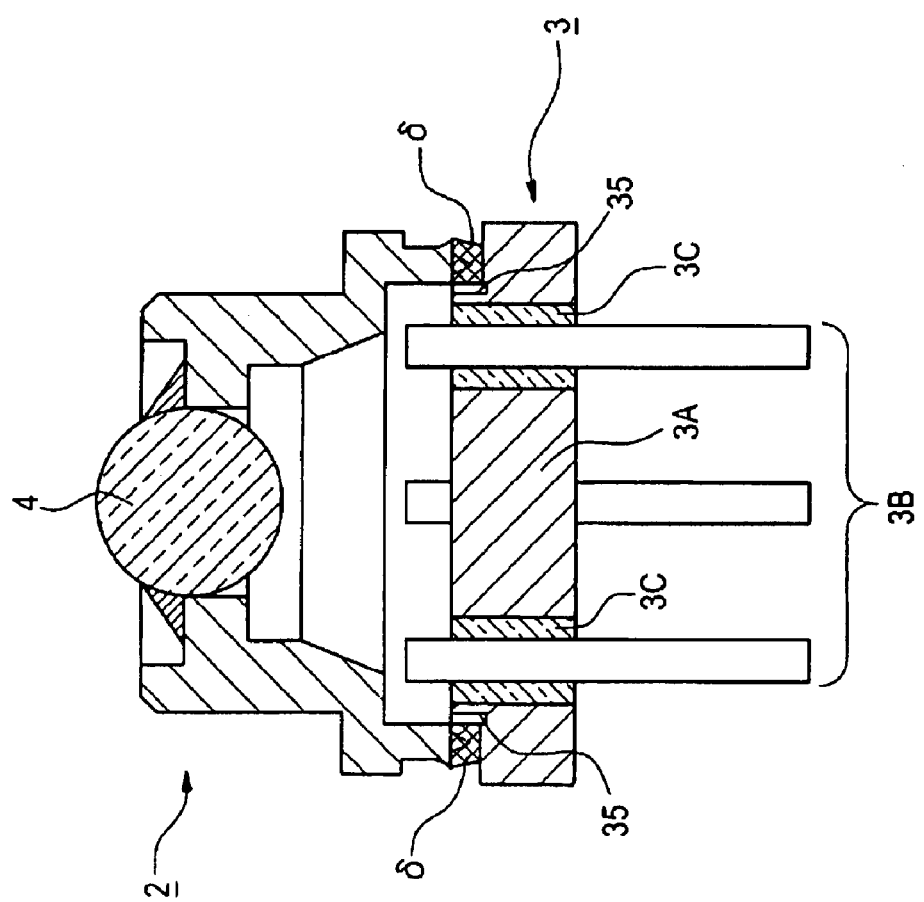
FIG. 6B shows a thermal distribution of the conventional arrangement.

When the stem 3A provides no groove in the primary surface 30 thereof, the heat may easily conduct to the seal glass 3C and the lead pin 3B as illustrated by the cross hatched area δ in FIG. 6B. Accordingly, it may be effective that the stem 3A provides the groove 35 in a position corresponding only to the seal glass 3C and the lead pin 3B.

Figure 7A:
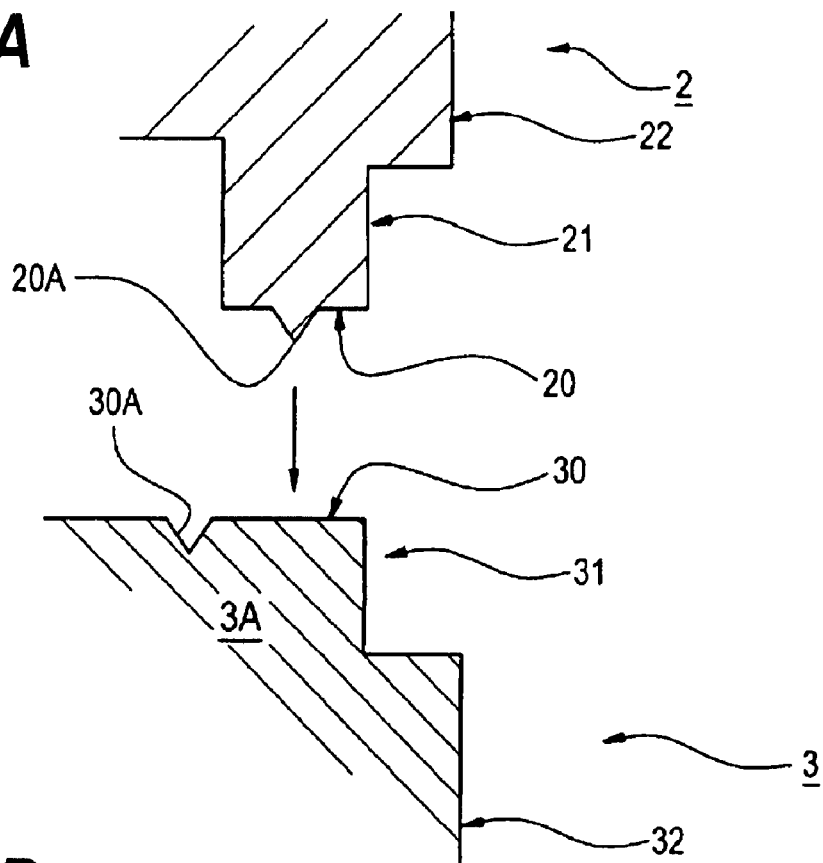
FIG. 7A is a cross section of the cap and the stem to be welded to each other according to the modification of the second embodiment shown in FIGS. 4A and 4B.
Figure 7B:
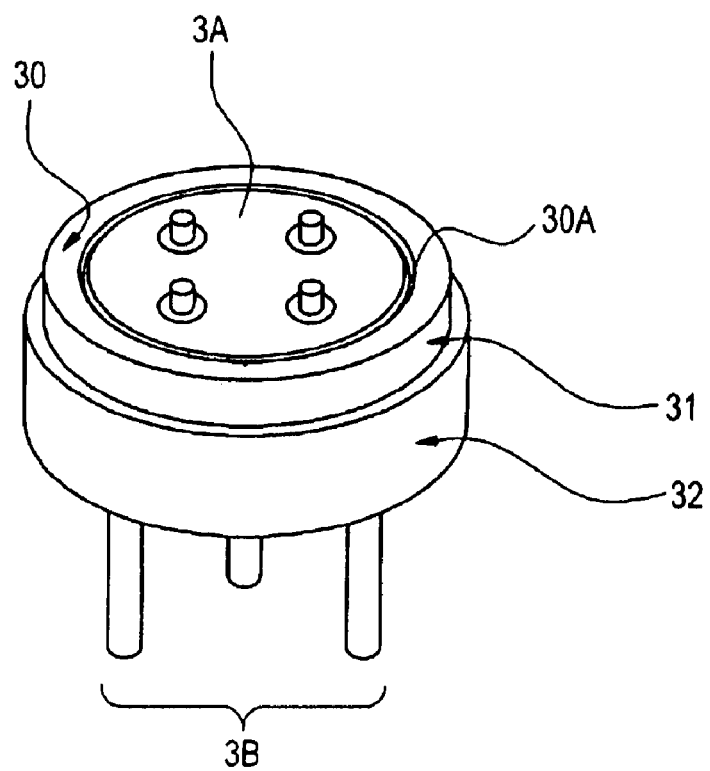
FIG. 7B is a perspective view of the stem of the modified embodiment.

As an modification of the present embodiment, the stem 3A provides a groove with a triangular cross section, as shown in FIGS. 7A and 7B, whose diameter is slightly smaller than that of the ring rib 20A in the end surface 20 of the cap 2. The groove 30A prevents the heat at the welding from conducting to the inner area of the stem 3A. Thus, similar to the second embodiment, the arrangement shown in FIGS. 7A and 7B may prevent the heat at the welding from affecting to the semiconductor device mounted on the center portion of the stem 3A.

In the first embodiment, the cap and the stem welded to each other provide first portions, 21 and 31, with relatively smaller diameter and second portions, 22 and 32, with relatively larger diameter. And the diameter of each first portion may be so determined that the portions deformed by the welding and extruding outward do not project from the outermost surface of the module, which is the outer surface of the second portions, 22 and 32. The extent of the deformed portion depends on (1) the materials of the cap 2 and the stem 3A, and (2) the position of the ring rib 20A, that is, how far the ring rib 20A from the outer surface of the first portions, 21 and 31. In the present embodiment, the rib 20A is apart from the outer surface by 250 μm at the top of the rib 20A. Therefore, when the ring rib 20A provides the base of 250 μm and the height of 200 μm in the cross section thereof, the step between the first portion, 21 or 31, and the second portion, 22 or 32, of at least 150 μm is enough for the deformed portion not to project from the outermost surface of the module.

Conventional optical module such as transmitter optical subassembly (TOSA) or receiver optical sub assembly (ROSA), where the cap is resistance-welded to the stem, projects the portion deformed at the resistance-welding over several tenth micron-meter. As a result, it is occasionally encountered that such optical module is unable to set within the housing of the optical transceiver due to such deformed portion becomes out of the design. The optical module according to the present invention does not cause such irregularity.

Moreover, the optical module may further provide the groove in the inner side of the stem, in addition to provide the first and the second portion with different diameters. The width of the groove may be determined by a similar manner to that of the first embodiment, that is, when the ring rib 20A in the top surface 20 of the cap provides the bottom of 250 µm and the height of 200 µm, the width of about 150 µm for the groove 35 may be enough and the depth thereof may be 400 µm, which is about twice of the height of the ring rib 20A.

Thus, the present invention may prevent not only the device mounted on the primary surface of the stem from sliding at the welding but also the heat at the welding from conducting to the seal glass and the lead pin, which also prevents the module from degrading the air-tightly sealing.

Numerous other embodiments can be envisaged without departing from the spirit and scope of the invention, which is defined in the claims.

What is claimed is:

1. An optical module with a co-axial package having a metal cap and a metal stem fixed by the resistance-welding to each other, characterized in that,
   the metal stem includes a first portion with a first diameter, a second portion with a second diameter greater than the first diameter, and a step between the first portion and the second portion, the first portion mounting a semiconductor optical device and having a deformed portion caused by the resistance-welding,
   the metal cap includes a first portion with a third diameter, a second portion with a fourth diameter greater than the third diameter, and a step between the first portion of the metal cap and the second portion of the metal cap, the first portion of the metal cap having a deformed portion caused by the resistance-welding,
   the first diameter of the metal stem is smaller than the fourth diameter of the metal cap, and the third diameter of the metal cap is smaller than the second diameter of the metal stem, and
   the second diameter of the metal stem and the fourth diameter of the metal cap are smaller than or equal to a diameter of an outermost surface of the optical module.

2. The optical module according to claim 1, wherein the stem is made of stainless steel and the cap is made of iron.

3. The optical module according to claim 1, wherein the second diameter of the metal stem is at least 300 µm greater than the first diameter of the metal stem.

4. The optical module according to claim 1, wherein the fourth diameter of the metal cap is at least 300 µm greater than the third diameter of the metal cap.

5. An optical module with a co-axial package, comprising:
   a semiconductor optical device;
   a metal cap that provides a ring rib in an end surface thereof;
   a metal stem with a disk shape, the ring rib of the metal cap being resistance-welded to the metal stem to seal a cavity air-tightly within which the semiconductor optical device is installed on a primary surface of the metal stem; and
   a plurality of lead pins extending from the metal stem, each lead pin being held by the metal stem through a seal glass,
   wherein the metal stem provides a groove along an inner edge of the ring rib of the metal cap to separate the lead pins from the ring rib of the cap, the ring rib being located radially exterior to the groove.

6. The optical module according to claim 5, wherein the groove is divided into a plurality of arched portions such that each portion has a same radius with respect to a center of the metal stem and separates the lead pin from the ring rib of the cap.

7. The optical module according to the claim 5, wherein the metal cap includes a first portion, a second portion, and a step between the first portion of the metal cap and the second portion of the metal cap, a diameter of the first portion of the metal cap being at least 300 µm larger than a diameter of the second portion of the metal cap, the ring rib being formed in the end surface of the first portion of the metal cap.

8. The optical module according to the claim 5, wherein the metal stem includes a first portion, a second portion, and a step between the first portion of the metal stem and the second portion of the metal stem, a diameter of the first portion of the metal stem is at least 300 µm larger than a diameter of the second portion of the metal stem, the first portion of the metal cap having the primary surface resistance-welded to the metal cap.

9. The optical module according to claim 8, wherein the metal cap includes a first portion and a second portion, a diameter of the first portion of the metal cap being at least 300 µm larger than a diameter of the second portion of the metal cap, the ring rib being formed in the end surface of the first portion of the metal cap.

10. The optical module according to claim 5, wherein a width and a depth of the groove is at least 150 µm and 400 µm.

* * * * *